(12) United States Patent
Wang et al.

(10) Patent No.: US 11,967,531 B2
(45) Date of Patent: Apr. 23, 2024

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Xiaoguang Wang, Hefei (CN); Yiming Zhu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 448 days.

(21) Appl. No.: 17/406,592

(22) Filed: Aug. 19, 2021

(65) Prior Publication Data
US 2022/0208611 A1 Jun. 30, 2022

Related U.S. Application Data

(63) Continuation of application No. PCT/CN2021/095828, filed on May 25, 2021.

(30) Foreign Application Priority Data

Dec. 29, 2020 (CN) .......................... 202011593434.9

(51) Int. Cl.
*H01L 21/8234* (2006.01)
*H01L 27/088* (2006.01)
(Continued)

(52) U.S. Cl.
CPC .... *H01L 21/823412* (2013.01); *H01L 27/088* (2013.01); *H01L 29/401* (2013.01);
(Continued)

(58) Field of Classification Search
CPC ........... H01L 21/823412; H01L 27/088; H01L 29/4236; H01L 29/7813; H01L 29/7825; H01L 29/66704
See application file for complete search history.

(56) References Cited

U.S. PATENT DOCUMENTS 6,121,080 A 9/2000 Wu
9,299,842 B2 3/2016 Baek
(Continued)

FOREIGN PATENT DOCUMENTS

CN 1495906 A 5/2004
CN 1702869 A 11/2005
(Continued)

OTHER PUBLICATIONS

Translation of International Search Report in the international application No. PCT/CN2021/095828, dated Sep. 15, 2021.
(Continued)

*Primary Examiner* — Joseph C. Nicely
(74) *Attorney, Agent, or Firm* — Ladas & Parry LLP (57) ABSTRACT

The present application relates to a semiconductor structure and its forming method. The semiconductor structure comprises a substrate; a first transistor that includes a first channel disposed within the substrate, and a first end disposed at surface of the substrate, the first end being adapted to connect with a first-type storage cell; a second transistor that includes a second channel disposed within the substrate, and a second end disposed at surface of the substrate, the second end being adapted to connect with a second-type storage cell, the second channel having a length greater than length of the first channel. The present application enables fabrication techniques of the first transistor and the second transistor compatible. Moreover, the present application is conducive to enhancing integration density of the storage cells of the first transistor and/or the second transistor in the memory lays foundation for enlarging the fields of application of the memory.

20 Claims, 4 Drawing Sheets

(51) Int. Cl.
  *H01L 29/40* (2006.01)
  *H01L 29/423* (2006.01)
  *H10B 12/00* (2023.01)
  *H10B 53/00* (2023.01)
  *H10B 61/00* (2023.01)
  *H10B 63/00* (2023.01)

(52) U.S. Cl.
  CPC .......... *H01L 29/4236* (2013.01); *H10B 12/00* (2023.02); *H10B 53/00* (2023.02); *H10B 61/22* (2023.02); *H10B 63/30* (2023.02)

(56) References Cited

U.S. PATENT DOCUMENTS

| | | | |
|---|---|---|---|
| 10,854,617 | B2 | 12/2020 | Derner |
| 11,348,972 | B1* | 5/2022 | Wu ................ H10B 12/00 |
| 2006/0237726 | A1 | 10/2006 | Toshiaki et al. |
| 2008/0073709 | A1* | 3/2008 | Fujimoto ........... H10B 12/053 |
| | | | 257/E21.429 |
| 2014/0077303 | A1 | 3/2014 | Baek |
| 2017/0033279 | A1 | 2/2017 | Lee |
| 2020/0161306 | A1* | 5/2020 | Seo ................ H10B 12/34 |
| 2020/0328220 | A1 | 10/2020 | Derner et al. |
| 2022/0208854 | A1* | 6/2022 | Zhu ................ H10B 12/31 |
| 2022/0208855 | A1* | 6/2022 | Zhu ................ H10N 70/231 |
| 2023/0343863 | A1* | 10/2023 | Baburske .......... H01L 29/7397 |

FOREIGN PATENT DOCUMENTS

| | | |
|---|---|---|
| CN | 102214578 A | 10/2011 |
| CN | 103904082 A | 7/2014 |
| CN | 106158751 A | 11/2016 |
| CN | 106935508 A | 7/2017 |
| CN | 107731907 A | 2/2018 |
| CN | 108133936 A | 6/2018 |
| CN | 109524383 A | 3/2019 |
| CN | 109524399 A | 3/2019 |
| CN | 209641689 U | 11/2019 |
| CN | 110943102 A | 3/2020 |
| CN | 111223862 A | 6/2020 |
| CN | 111755386 A | 10/2020 |
| CN | 111799260 A | 10/2020 |
| JP | 08316427 A | 11/1996 |
| JP | 2014049725 A | 3/2014 |

OTHER PUBLICATIONS

T. Schloesser et al., "A 6F2 Buried Wordline DRAM Cell for 40nm and Beyond", Published in: 2008 IEEE International Electron Devices Meeting, Date of Conference: Dec. 15-17, 2008, Date Added to IEEE Xplore: Feb. 27, 2009, DOI: 10.1109/IEDM.2008.4796820, Publisher: IEEE.

An Chen, "A review of emerging non-volatile memory (NVM) technologies and applications", (Solid-State Electronics vol. 125, Nov. 2016, pp. 25-38), https://www.sciencedirect.com/science/article/abs/pii/S0038110116300867.

P. M. Kibuule et al., "CMOS Effective Channel Size Measurements", Superconducting Super Collider Laboratory, Jan. 1994, https://lss.fnal.gov/archive/other/ssc/ssc-n-845.pdf.

Ravi Patel et al., "Field Driven STT-MRAM Cell for Reduced Switching Latency and Energy", Published in: 2014 IEEE International Symposium on Circuits and Systems (ISCAS), Date of Conference: Jun. 1-5, 2014, Date Added to IEEE Xplore: Jul. 26, 2014, DOI: 10.1109/ISCAS.2014.6865599, Publisher: IEEE, pp. 2173-2176.

* cited by examiner

SEMICONDUCTOR STRUCTURE AND FORMING METHOD THEREOF

CROSS-REFERENCE TO RELATED APPLICATIONS

This application is a continuation of International Patent Application No. PCT/CN2021/095828, filed on May 25, 2021, which claims the priority of Chinese Patent Application No. 202011593434.9, filed on Dec. 29, 2020. The entire contents of the aforementioned patent applications are herein incorporated by reference in their entirety.

TECHNICAL FIELD

The present application relates to the technical field of semiconductor fabrication, and more particularly to a semiconductor structure and its forming method.

BACKGROUND

The dynamic random access memory (DRAM) is a semiconductor device frequently used in electronic equipment such as computers. It consists of plural storage cells, each of which usually includes a transistor and a capacitor. The gate electrode of the transistor is electrically connected to the wordline, the source electrode is electrically connected to the bitline, the drain electrode is electrically connected to the capacitor, and wordline voltage on the wordline can control the On & Off of the transistor, so that data information stored in the capacitor can be read via the bitline, or data information can be written into the capacitor.

The magnetic random access memory (MRAM) is an integration based on silicon-based complementary oxide semiconductor (CMOS) and magnetic tuning junction (MTJ) technologies, being a nonvolatile memory, it possesses both the high-speed writing and reading capabilities of a static random access memory and the high integration of a dynamic random access memory. The magnetic tuning junction usually consists of a fixed layer, a tunneling layer and a free layer. When the magnetic random access memory normally operates, magnetization direction of the free layer may change, while magnetization direction of the fixed layer remains unchanged. Resistance of the magnetic random access memory is relevant to the relative magnetization directions of the free layer and the fixed layer. When the magnetization direction of the free layer changes relative to the magnetization direction of the fixed layer, resistance value of the magnetic random access memory correspondingly changes to correspond to different storage information.

In order to enhance storage density of the memory, and to reduce size of the storage cell, buried wordline (BWL) has been widely used in DRAM. However, in order to avoid the occurrence of leakage current, it required for DRAMs with buried wordline structure to employ relatively small drive current to drive the transistor. But as for MRAMs, since it is needed to ensure start of the MTJ switch, relatively large drive current is required to be used to drive the transistor. Since the drive current of DRAMs and the drive current of MRAMs are different in magnitude, it is currently impossible to implement the buried wordline structure in MRAM, and this restricts enlargement of storage density and reduction in size of storage cell of MRAMs.

It is therefore a technical problem to be urgently dealt with as how to enhance the performance of the memory, so as to enlarge the fields of application of the memory.

SUMMARY

The present application proposes a semiconductor structure and a method of forming the same to solve the problem that currently available memories are inferior in performance, and to enlarge the fields of application of the memory.

In order to deal with the aforementioned problem, embodiments of the present application provide a semiconductor structure that comprises:

a substrate;

a first transistor, including a first channel disposed within the substrate, and a first end disposed at surface of the substrate, the first end being adapted to connect with a first-type storage cell; and a second transistor, including a second channel disposed within the substrate, and a second end disposed at surface of the substrate, the second end being adapted to connect with a second-type storage cell, the second channel having a width greater than width of the first channel.

In one of the embodiments, the width of the second channel is 1.5 to 3 times that of the first channel.

In one of the embodiments, the substrate includes therein at least one first active area, in which are disposed two first transistors, the two first transistors are distributed at opposite sides along extension direction of the first active area, and the two first transistors disposed in the first active area have a first common end.

In one of the embodiments, the substrate further includes therein at least one second active area, in which are disposed two second transistors, the two second transistors are distributed at opposite sides along extension direction of the second active area, and the two second transistors disposed in the second active area have a second common end.

In one of the embodiments, the substrate further includes therein at least one third active area, in which are disposed the first transistor and the second transistor, the first transistor and the second transistor are distributed at opposite sides along extension direction of the third active area, and the first transistor and the second transistor disposed in the third active area have a third common end.

In one of the embodiments, the substrate further includes a plurality of wordlines extending along a first direction, a plurality of the third active areas are arranged within the substrate in an array, the third active areas extend along a second direction, and the second direction is inclined relative to the first direction for a predetermined angle.

In one of the embodiments, the first transistor and the second transistor disposed in the adjacent third active areas are oppositely arranged along the second direction.

In one of the embodiments, the first transistor and the second transistor disposed in the adjacent third active areas correspond to the same and single wordline along the first direction.

In one of the embodiments, the width of the second channel is 1.5 to 2 times that of the first channel.

In one of the embodiments, the substrate further includes a plurality of wordlines extending along a first direction, a plurality of the third active areas are arranged within the substrate in an array, the third active areas extend along a third direction, and the third direction is perpendicular to the first direction.

In one of the embodiments, the first transistors or the second transistors in the adjacent third active areas approach one another along the third direction.

In one of the embodiments, the wordline includes first sub wordlines and second sub wordlines alternately arranged along the third direction, the first transistors in the plurality of the third active areas arranged along the first direction all overlap with the same and single first sub wordline, and the second transistors in the plurality of the third active areas arranged along the first direction all overlap with the same and single second sub wordline.

In one of the embodiments, the width of the second channel is 2 to 3 times that of the first channel.

In one of the embodiments, projections of the two adjacent third active areas arranged along the third direction partially overlap with each other, and the projections are projections of the third active areas onto the third direction.

In one of the embodiments, the first transistors of the two adjacent third active areas arranged along the third direction correspond to the same and single wordline.

In one of the embodiments, the first-type storage cell includes anyone of a capacitance storage cell, a resistance storage cell, a magnetic storage cell, a phase-change storage cell and a ferroelectric storage cell; the second-type storage cell includes anyone of a capacitance storage cell, a resistance storage cell, a magnetic storage cell, a phase-change storage cell and a ferroelectric storage cell; the first-type storage cell and the second-type storage cell are different in storage type.

In one of the embodiments, the first-type storage cell is a capacitance storage cell, and the second-type storage cell is a magnetic storage cell.

In order to deal with the aforementioned problem, embodiments of the present application further provide a method of forming a semiconductor structure, which method comprises the following steps:

providing a substrate; and forming a first transistor and a second transistor in the substrate, the first transistor including a first channel disposed within the substrate, and a first end disposed at surface of the substrate, the first end being adapted to connect with a first-type storage cell, the second transistor including a second channel disposed within the substrate, and a second end disposed at surface of the substrate, the second end being adapted to connect with a second-type storage cell, the second channel having a width greater than width of the first channel.

In one of the embodiments, the step of forming a first transistor and a second transistor in the substrate includes the following specific steps:

forming an active area in the substrate, the active area including a first part and a second part, and width of the second part being greater than width of the first part:

forming a first gate slot and a second gate slot respectively in the first part and the second part of the active area, the active area being cut by the first gate slot and the second gate slot into a first end, a second end, and a common end between the first end and the second end; and filling gate material into the first gate slot and the second gate slot to form a first gate electrode and a second gate electrode.

In one of the embodiments, the method of forming a semiconductor structure further comprises the following steps:

etching the active area, to respectively form the first gate slot and the second gate slot at opposite sides of extension direction of the active area; and filling gate material in the first gate slot and the second gate slot in the active area, to form the first gate electrode and the second gate electrode.

In one of the embodiments, further included is a step of forming in the substrate a plurality of wordlines extending along a first direction, wherein a plurality of the active areas are arranged within the substrate in an array, the active areas extend along a second direction, and the second direction is inclined relative to the first direction for a predetermined angle.

In one of the embodiments, the first transistor in one of the two adjacent active areas and the second transistor in another one of the active areas are disposed opposite each other along the second direction.

In one of the embodiments, the first transistor in one of the two adjacent active areas and the second transistor in another one of the active areas correspond to the same and single wordline along the first direction.

In one of the embodiments, further included is a step of forming in the substrate a plurality of wordlines extending along a first direction, wherein the plurality of the active areas are arranged within the substrate in an array, the active areas extend along a third direction, and the third direction is perpendicular to the first direction.

In one of the embodiments, the first transistors or the second transistors in the adjacent two active areas approach one another along the third direction.

In one of the embodiments, the wordline includes first sub wordlines and second sub wordlines alternately arranged along the third direction, the first transistors in the plurality of the active areas arranged along the first direction all overlap with the same and single first sub wordline, and the second transistors in the plurality of the active areas arranged along the first direction all overlap with the same and single second sub wordline.

In one of the embodiments, projections of the two adjacent active areas arranged along the third direction partially overlap with each other, and the projections are projections of the active areas onto the third direction.

In one of the embodiments, the first-type storage cell includes anyone of a capacitance storage cell, a resistance storage cell, a magnetic storage cell, a phase-change storage cell and a ferroelectric storage cell; the second-type storage cell includes anyone of a capacitance storage cell, a resistance storage cell, a magnetic storage cell, a phase-change storage cell and a ferroelectric storage cell; the first-type storage cell and the second-type storage cell are different in storage type.

In one of the embodiments, the first-type storage cell is a capacitance storage cell, and the second-type storage cell is a magnetic storage cell.

The semiconductor structure and its forming method proposed by the embodiments of the present application achieve the effect of making fabrication techniques of the first transistor and the second transistor compatible, and simplify the fabrication method of the semiconductor structure by simultaneously disposing in the semiconductor structure a first transistor for connection with a first-type storage cell and a second transistor for connection with a second-type storage cell, locating the first channel and the second channel both inside the substrate, and defining the width of the first channel in the first transistor to be less than the width of the second channel in the second transistor. Moreover, it is ensured that drive current of the second transistor is greater than drive current of the first transistor, and this is conducive to enhancing integration density and device performance of the storage cells of the first transistor and/or the second transistor in the memory, reduces the size of the storage cells, and lays foundation for enlarging the fields of application of the memory.

DETAILED DESCRIPTION OF EMBODIMENTS

Detailed description is made below to the specific embodiments of the semiconductor structure and its forming method proposed by the present application in conjunction with the accompanying drawings.

Figure 1:
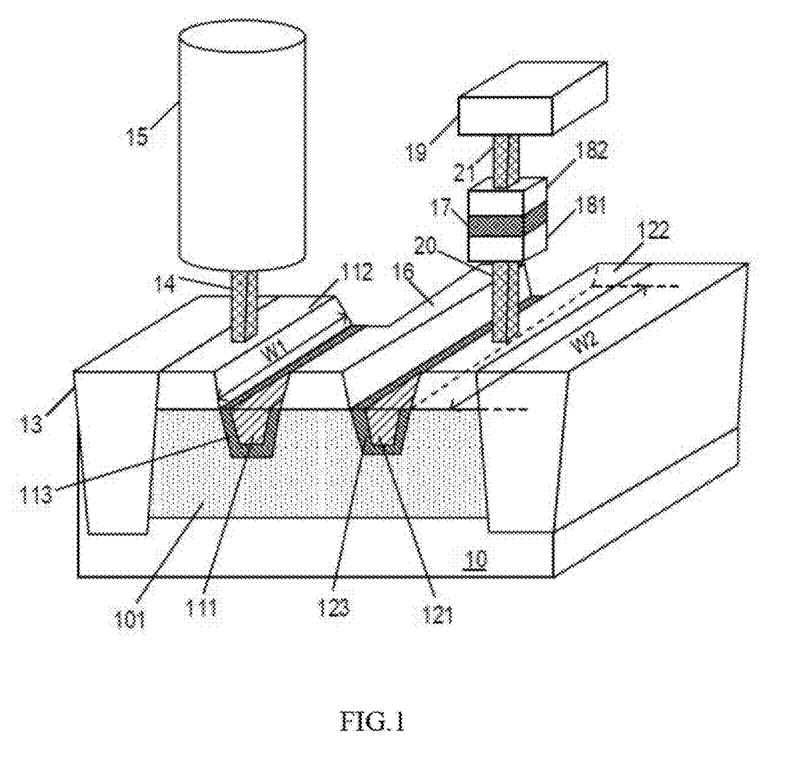
FIG. 1 is a diagram schematically illustrating the semiconductor structure in the specific embodiments of the present application.

This specific embodiment proposes a semiconductor structure, and FIG. 1 is a diagram schematically illustrating the semiconductor structure in a specific embodiment of the present application. Referring to FIG. 1, the semiconductor structure provided by the embodiment of the present application comprises:

a substrate 10;

a first transistor, including a first channel disposed within the substrate 10, and a first end 112 disposed at surface of the substrate 10, the first end 112 being adapted to connect with a first-type storage cell 15; and a second transistor, including a second channel disposed within the substrate 10, and a second end 122 disposed at surface of the substrate 10, the second end 122 being adapted to connect with a second-type storage cell 17, the second channel having a width W2 greater than width W1 of the first channel.

Specifically speaking, referring to FIG. 1, the substrate 10 can be, but is not restricted to be, a silicon substrate. This specific embodiment takes a silicon substrate as an example to describe the substrate 10. In other examples, the substrate 10 may be such a semiconductor substrate as of gallium nitride, gallium arsenide, gallium carbide, silicon carbide or SOI. In the substrate 10 are arranged a plurality of active areas in an array, and adjacent active areas are separated from each other via a shallow groove separation structure 13. The first transistor and the second transistor can be located either in the same and single active area, or in different active areas.

The first channel of the first transistor and the second channel of the second transistor are both entirely located inside the substrate 10, accordingly, during the process of forming the first transistor and the second transistor, it is possible to simultaneously form the first channel and the second channel by etching the substrate 10, thereby realizing fabrication techniques of the first transistor and the second transistor compatible, and helping to enhance integration density and device performance of the storage cells of the first transistor and/or the second transistor in the memory, and to reduce the size of the storage cells.

The substrate 10 can have therein a P-type well region 101 formed by p-type ion doping; the first end 112 of the first transistor and the second end 122 of the second transistor are correspondingly both source electrodes or drain electrodes formed by n-type ion doping. If the first end 112 of the first transistor is a drain electrode, another end of the first transistor will be a source electrode, and the region between the source electrode and the drain electrode of the first transistor is the first channel of the first transistor. If the second end 122 of the second transistor is a drain electrode, another end of the second transistor will be a source electrode, and the region between the source electrode and the drain electrode of the second transistor is the second channel of the second transistor. Specifically, referring to FIG. 1, the first transistor and the second transistor have a common end 16. The common end 16 can be a source electrode shared by the first transistor and the second transistor, the surface region of the substrate 10 between the common end 16 and the first end 112 can be the first channel of the first transistor, and the width W1 of the first channel can be the length of the line intersected by the first channel and the first end 112. The surface region of the substrate 10 between the common end 16 and the second end 122 is the second channel of the second transistor, and the width W2 of the second channel can be the length of the line intersected by the second channel and the second end 122. The first channel and the second channel can have certain thicknesses, i.e., the surface regions of the substrate can include substrate inner regions having certain thicknesses, and such thicknesses can be adjusted through adjustment of the ion doping condition. By setting the width W2 of the second channel to be greater than the width W1 of the first channel, drive current of the second transistor is made to be greater than drive current of the first transistor, thereby satisfying different requirements of the first transistor and the second transistor on drive currents, so that two different types of transistors can be integrated in one memory, thus realizing complementary advantages of two types of transistors, hence enhancing performance of the memory, and enlarging fields of application of the memory.

In some embodiments, the substrate 10 can have therein an N-type well region 101 formed by N-type ion doping. The first end 112 of the first transistor and the second end 122 of the second transistor are correspondingly both of p-type ion doping.

In some embodiments, the width W2 of the second channel is 1.5 to 3 times the width W1 of the first channel.

Referring to FIG. 1, the first channel encloses the first gate electrode 111 of the first transistor, and between the first channel and the first gate electrode 111 is further disposed a first gate electrode medium layer 113, which covers the first channel from above. The second channel encloses the second gate electrode 121 of the second transistor, and between the second channel and the second gate electrode 121 is further disposed a second gate electrode medium layer 123, which covers the second channel from above. Materials of the first gate electrode medium layer 113 and the second gate electrode medium layer 123 can be either identical or different. In order to simplify fabrication technique, materials of the first gate electrode medium layer 113 and the second gate electrode medium layer 123 are identical, for instance, both as an oxide material (such as silicon dioxide).

Figure 2:
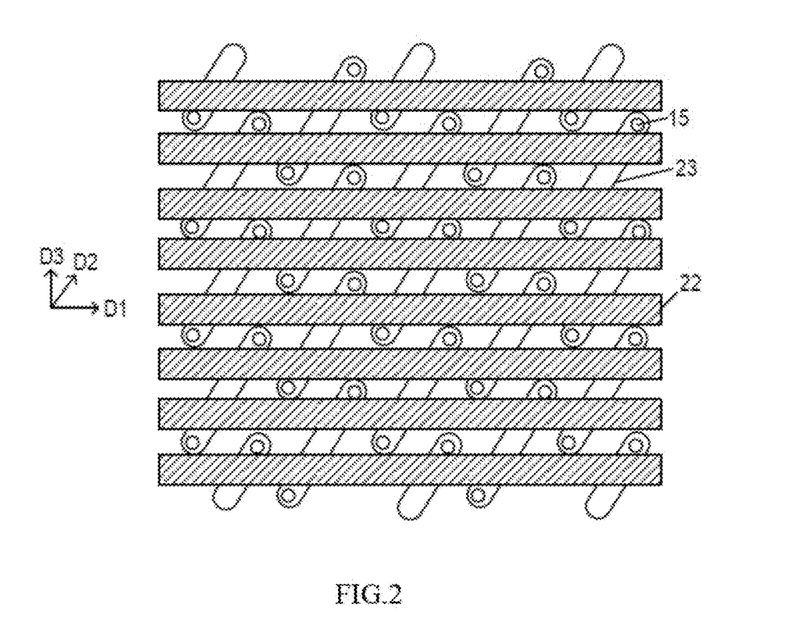
FIG. 2 is a diagram schematically illustrating the mode of arranging a plurality of first active areas in the specific embodiments of the present application.

In some embodiments, the substrate 10 further includes therein at least one first active area 23, and the first active area 23 has two first transistors; the two first transistors are distributed at opposite sides along extension direction of the first active area 23, and the two first transistors disposed in the first active area share a first common end.

FIG. 2 is a diagram schematically illustrating the mode of arranging a plurality of first active areas in the specific embodiments of the present application. By way of example, referring to FIG. 2, the substrate 10 has therein a plurality of wordlines 22 extending along a first direction D1, and the wordlines 22 are arranged in parallel along a third direction D3 that is perpendicular to the first direction D1. A plurality of first active areas 23 are arranged within the substrate 10 in an array, and each first active area 23 extends along a second direction D2. The second direction D2 is inclined relative to the first direction D1 for a predetermined angle. The specific numerical value of the predetermined angle can be set by persons skilled in the art according to actual requirement, for instance, the predetermined angle can be greater than or equal to 15o and less than 30o. Two wordlines 22 pass through one first active area 23 and respectively control two first transistors on the first active area 23, and two first channels of the two first transistors are both located within the substrate 20 and have identical width. The two first transistors are distributed at opposite sides of the first active area 23 along the second direction D2. The width W1 of the first channel can be the length of the first channel along the first direction D1. First ends 112 of the two first transistors are both located at the surface of the substrate 20, and the two first transistors share the first common end. For instance, the first end 112 of the first transistor is a drain end, the first common end is a first common source end, and the two first transistors in the same and single first active area 23 share the first common source end. The first common end can be disposed at the middle portion of the first active area 23, namely the part between two wordlines 22 on the first active area 23. The two first transistors in the same first active area 23 are respectively electrically connected with two first-type storage cells 15. As can be understood, the first gate electrode 111 can be the part of the wordline 22 located on the first transistor of the first active area 23. Specifically, referring to FIG. 2, the substrate 10 includes a plurality of first active areas 23 and shallow groove separation structures between the first active areas 23, wordlines 22 pass through the plurality of first active areas 23 and shallow groove separation structures between the first active areas 23, and the part overlapped by wordlines 22 and first active areas 23 can be the first gate electrode 111.

Figure 3:
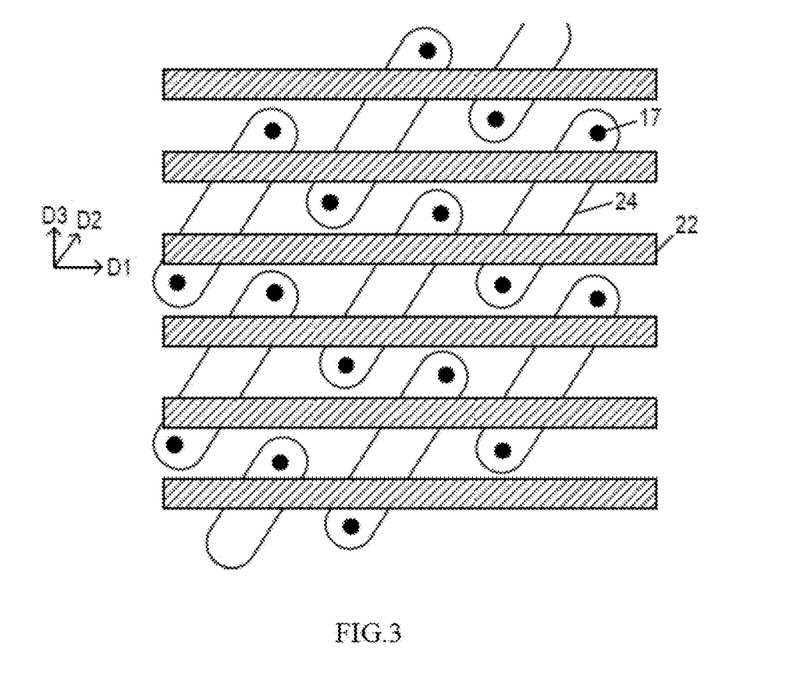
FIG. 3 is a diagram schematically illustrating the mode of arranging a plurality of second active areas in the specific embodiments of the present application.

In some embodiments, the substrate 10 further includes therein at least one second active area 24, and the second active area 24 has two second transistors; the two second transistors are distributed at opposite sides along extension direction of the second active area 24, and the two second transistors disposed in the second active area 24 share a second common end.

FIG. 3 is a diagram schematically illustrating the mode of arranging a plurality of second active areas in the specific embodiments of the present application. By way of example, referring to FIG. 3, the substrate 10 has therein a plurality of wordlines 22 extending along a first direction D1, and the wordlines 22 are arranged in parallel along a third direction D3 that is perpendicular to the first direction D1. A plurality of second active areas 24 are arranged within the substrate 10 in an array, and each second active area 24 extends along a second direction D2. The second direction D2 is inclined relative to the first direction D1 for a predetermined angle. The specific numerical value of the predetermined angle can be set by persons skilled in the art according to actual requirement, for instance, the predetermined angle can be greater than or equal to 15o and less than 30o. Each second active area 24 has two second transistors, and second channels of the two second transistors are both located within the substrate 20 and have identical width. The two second transistors are distributed at opposite sides of the second active area 24 along the second direction D2. The width W2 of the second channel can be the length of the second channel along the first direction D1. Second ends 122 of the two second transistors are both located at the surface of the substrate 20, and the two second transistors share the second common end. For instance, the second end 122 of the second transistor is a drain end, the second common end is a second common source end, and the two second transistors in the same and single second active area 24 share the second common source end. The second common end can be disposed at the middle portion of the second active area 24, namely the part between two wordlines 22 on the second active area 24. The two second transistors in the same second active area 24 are respectively electrically connected with two second-type storage cells 17. As can be understood, the second gate electrode 121 can be the part of the wordline 22 located on the second transistor of the second active area 24. Specifically, referring to FIG. 2, the substrate 10 includes a plurality of second active areas 24 and shallow groove separation structures between the second active areas 24, wordlines 22 pass through the plurality of second active areas 24 and shallow groove separation structures between the second active areas 24, and the part overlapped by wordlines 22 and second active areas 24 can be the second gate electrode 121.

Figure 4:
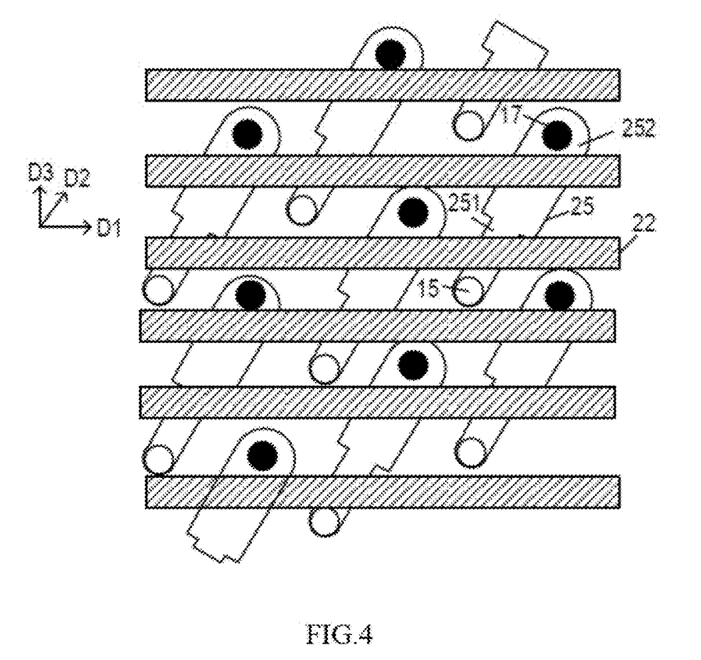
FIG. 4 is a diagram schematically illustrating a mode of arranging a plurality of third active areas in the specific embodiments of the present application.

In some embodiments, the substrate 10 further includes therein at least one third active area 25, and the third active area 25 has a first transistor and a second transistor.

The first transistor and the second transistor are distributed at opposite sides along extension direction of the third active area 25, and the first transistor and the second transistor disposed in the third active area 25 share a third common end.

In some embodiments, the semiconductor structure further includes a plurality of wordlines extending along a first direction D1.

A plurality of third active areas 25 are arranged within the substrate 10 in an array, and extend along a second direction D2, and the second direction D2 is inclined relative to the first direction D1 for a predetermined angle.

FIG. 4 is a diagram schematically illustrating the mode of arranging a plurality of third active areas in the specific embodiments of the present application. By way of example, referring to FIGS. 1 and 4, the substrate 10 has therein a plurality of wordlines 22 extending along a first direction D1, and the wordlines 22 are arranged in parallel along a third direction D3 that is perpendicular to the first direction D1. A plurality of third active areas 25 are arranged within the substrate 10 in an array, and each third active area 25 extends along a second direction D2. The second direction D2 is inclined relative to the first direction D1 for a predetermined angle. The specific numerical value of the predetermined angle can be set by persons skilled in the art according to actual requirement, for instance, the predetermined angle can be greater than or equal to 15o and less than 30o. Each third active area 25 has a first transistor and a second transistor, and the first transistor and the second transistor are distributed at opposite sides of the third active area 25 along the second direction D2. Two wordlines 22 pass through one third active area 25 and respectively control the first transistor and the second transistor on the third active area 25. The width W1 of the first channel is the length of the first channel along the first direction D1, and width W2 of the second channel is the length of the second channel along the second direction D2. The first end 112 of the first transistor and the second end 122 of the second transistor are both located at the surface of the substrate 20, and the first transistor and the second transistor located in the same and single third active area 25 share a third common end. For instance, the first end 112 of the first transistor is a drain end, the second end 122 of the second transistor is a drain end, the third common end is a third common source end, and the first transistor and the second transistor in the same and single third active area 25 share the third common source end. The third common end can be disposed at the middle portion of the third active area 25, namely the part between two wordlines 22 on the third active area 25. The third common end includes a first side facing towards the first channel, and a second side opposite the first side, the second side faces towards the second channel. Since the width of the first channel of the first transistor is less than the width of the second channel of the second transistor, the width (the length of the line intersecting the first channel) of the first side of the third common source end is less than the width of the second side (the length of the line intersecting the second channel). In the same and single third active area 25, the first end 112 of the first transistor is for connection with a first-type storage cell 15, and the second end 122 of the second transistor is for connection with a second-type storage cell 17. As can be understood, the first gate electrode 111 can be the part of the wordline 22 located on the first transistor of the third active area 25; the second gate electrode 121 can be the part of the wordline 22 located on the second transistor of the third active area 25. Specifically, as shown in FIG. 4, the substrate 10 includes a plurality of third active areas 25 and shallow groove separation structures between the third active areas 25, wordlines 22 pass through the plurality of third active areas 25 and shallow groove separation structures between the third active areas 25, and the part overlapped by wordlines 22 and third active areas 25 can be the first gate electrode 111 or the second gate electrode 121. For instance, the part overlapped by a wordline 22 and the first transistor on the third active area 25 is the first gate electrode 111, and the part overlapped by a wordline 22 and the second transistor on the third active area 25 is the second gate electrode 121.

In some embodiments, the first transistor and the second transistor disposed in adjacent third active areas 25 are oppositely arranged along the second direction D2.

In some embodiments, the first transistor and the second transistor disposed in adjacent third active areas 25 correspond to the same and single wordline 22 along the first direction D1.

Specifically, referring to FIG. 4, by configuring the types of transistors at close end portions in adjacent third active areas 25 to be different on the second direction D2, and by enabling first transistors and second transistors in adjacent third active areas 25 to correspond to the same and single wordline 22 along the first direction D1, it is made possible to simultaneously drive the first and second transistors through one wordline 22, thereby enhancing drive efficiency of the semiconductor structure, and realizing high-speed rate reading of the memory. At the same time, by arranging the first transistors and the second transistors as alternate distribution, distances between first transistors and between second transistors are increased, whereby it is possible to lower fabrication difficulty.

In some embodiments, the width of the second channel is 1.5 to 2 times that of the first channel. Specifically, when the first end 112 of a first transistor is electrically connected to a capacitance storage cell and the second end 122 of a second transistor is electrically connected to a magnetic storage cell, and the same and single wordline 22 controls the first transistor and the second transistor simultaneously, if the difference in widths between the first channel and the second channel is unduly large, it would be more difficult for the wordline 22 to control. The aforementioned width range of the first channel and the second channel makes it possible to best equalize the requirement for drive current and control difficulty.

Figure 5:
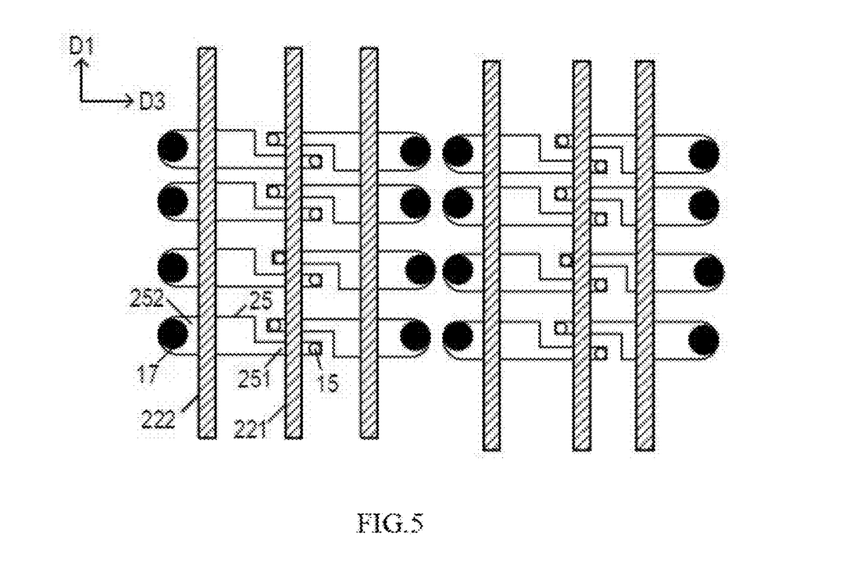
FIG. 5 is a diagram schematically illustrating another mode of arranging a plurality of third active areas in the specific embodiments of the present application.

FIG. 5 is a diagram schematically illustrating another mode of arranging a plurality of third active areas in the specific embodiments of the present application. In some embodiments, referring to FIG. 5, the semiconductor structure further includes a plurality of wordlines 22 extending along a first direction D1; a plurality of third active areas 25 are arranged within the substrate 10 in an array, the third active areas 25 extend along a third direction D3, and the third direction D3 is perpendicular to the first direction D1.

In some embodiments, the first transistors or the second transistors in the adjacent third active areas 25 approach one another along the third direction D3.

In some embodiments, the wordline 22 includes first sub wordlines and second sub wordlines alternately arranged along the third direction D3, the first transistors in the plurality of the third active areas 25 arranged along the first direction D1 all overlap with the same and single first sub wordline 221, and the second transistors in the plurality of the third active areas 25 arranged along the first direction D1 all overlap with the same and single second sub wordline 222.

In some embodiments, projections of two adjacent third active areas 25 arranged along the third direction D3 partially overlap with each other, and the projections are projections of the third active areas 25 onto the third direction D3.

In some embodiments, the first transistors of two adjacent third active areas 25 arranged along the third direction D3 correspond to the same and single wordline.

Specifically speaking, referring to FIG. 5, the substrate 20 has therein a plurality of third active areas 25 arranged in an array, and each third active area 25 extends along a direction (namely the third direction) that is perpendicular to the extension direction (namely the first direction) of the wordline. Moreover, the partial overlap of projections of two adjacent third active areas 25 arranged along the third direction D3 can greatly increase the arrangement density of the third active areas 25, enhance the density of storage cells in the semiconductor structure, and help reduce sizes of the storage cells. Each third active area 25 has therein a first transistor and a second transistor. The first transistor and the second transistor are distributed at opposite sides of the third active area 25 along the third direction D3. Two wordlines 22 pass through one third active area 25 and respectively control the first transistor and the second transistor on the third active area 25. The width W1 of the first channel is the length of the first channel along the first direction D1, and width W2 of the second channel is the length of the second channel along the first direction D1. The first transistor and the second transistor located in the same and single third active area 25 share a third common end. The third common end can be disposed at the middle portion of the third active area 25, namely the part between two wordlines 22 on the third active area 25. The third common end includes a first side facing towards the first channel, and a second side opposite the first side, the second side faces towards the second channel. Since the width of the first channel of the first transistor is less than the width of the second channel of the second transistor, the width (the width along the first direction D1) of the first side of the third common end is less than the width of the second side (the width along the first direction D1).

Through the definition that the first transistors or the second transistors in the adjacent third active areas 25 approach one another along the third direction D3, that the first transistors in the plurality of the third active areas 25 arranged along the first direction D1 all overlap with the same and single first sub wordline 221, and that the second transistors in the plurality of the third active areas 25 arranged along the first direction D1 all overlap with the same and single second sub wordline 222, the same and single first sub wordline 221 is enabled to simultaneously drive the first transistors in two adjacent third active areas 25, and the same and single second sub wordline 222 is enabled to simultaneously drive the second transistors in two adjacent third active areas 25, whereby the drive method of the semiconductor structure is simplified, and the first transistors or second transistors can be flexibly controlled. Furthermore, correspondence of two adjacent first transistors in two adjacent third active areas 25 arranged along the third direction D3 to the same and single wordline 221 further simplifies the drive method of the semiconductor structure and increases the storage density.

In some embodiments, the width of the second channel is 2 to 3 times that of the first channel. Specifically, when the first end 112 of the first transistor is electrically connected to a capacitance storage cell and the second end 122 of the second transistor is electrically connected to a magnetic storage cell, the optimal device performance can be obtained with the widths of the first channel and the second channel lying within the above range. Specifically, a lesser width of the first channel of the first transistor makes it insofar as possible to decrease leakage current, while a larger width of the second channel of the second transistor makes it insofar as possible to increase drive current, thus enhancing device performance.

In some embodiments, the third active area 25 includes a first part 251 and a second part 252, and width of the second part 252 is greater than width of the first part 251. The width of the first part 251 can be the width of the first part 251 of the third active area 25 perpendicular with respect to the extension direction of the third active area 25. By the same token, the width of the second part 252 can be the width of the second part 252 of the third active area 25 perpendicular with respect to the extension direction of the third active area 25. Specifically, as shown in FIGS. 1, 4 and 5, two wordlines 22 respective intersect the first part 251 and the second part 252 of one third active area 25, and the single one third active area 25 is cut by two wordlines 22 into a first end 112, a second end 122 and a third common end 16. The first end 112 can be the drain electrode of the first transistor, the second end 122 can be the drain electrode of the second transistor, and the third common end 16 can be the source electrode shared by the first transistor and the second transistor. Specifically, as shown in FIG. 4, the width of the first channel can be the width of the region overlapped by a wordline 22 and the first part 251 of the third active area 25 on the extension direction of wordline 22, and the width of the second channel can be the width of the region overlapped by the wordline 22 and the second part 252 of the third active area 25 on the extension direction of wordline 22. Sizes of the regions overlapped by wordlines 22 and third active areas 25 can be adjusted by setting the widths of first parts and second parts of third active areas 25, to hence change the widths of the channels.

In some embodiments, the first-type storage cell 15 includes anyone of a capacitance storage cell, a resistance storage cell, a magnetic storage cell, a phase-change storage cell and a ferroelectric storage cell; the second-type storage cell 17 includes anyone of a capacitance storage cell, a resistance storage cell, a magnetic storage cell, a phase-change storage cell and a ferroelectric storage cell; the first-type storage cell 15 and the second-type storage cell 17 are different in storage type.

In some embodiments, the first-type storage cell 15 is a capacitance storage cell, and the second-type storage cell 17 is a magnetic storage cell.

By way of example, as shown in FIG. 1, the first-type storage cell 15 is a capacitance storage cell, and the second-type storage cell 17 is a magnetic storage cell (such as a magnetic tuning junction). The capacitance storage cell is electrically connected to the first end 112 of the first transistor via a first plug 14. The bottom end of the magnetic storage cell is connected to a bottom-contact electrode 181, the top end of the magnetic storage cell is connected to a top-contact electrode 182, the bottom-contact electrode 181 is electrically connected to the second end 122 of the second transistor via a second plug 20, and the top-contact electrode 182 is electrically connected to a bitline 19 via a third plug 21.

Figure 6:
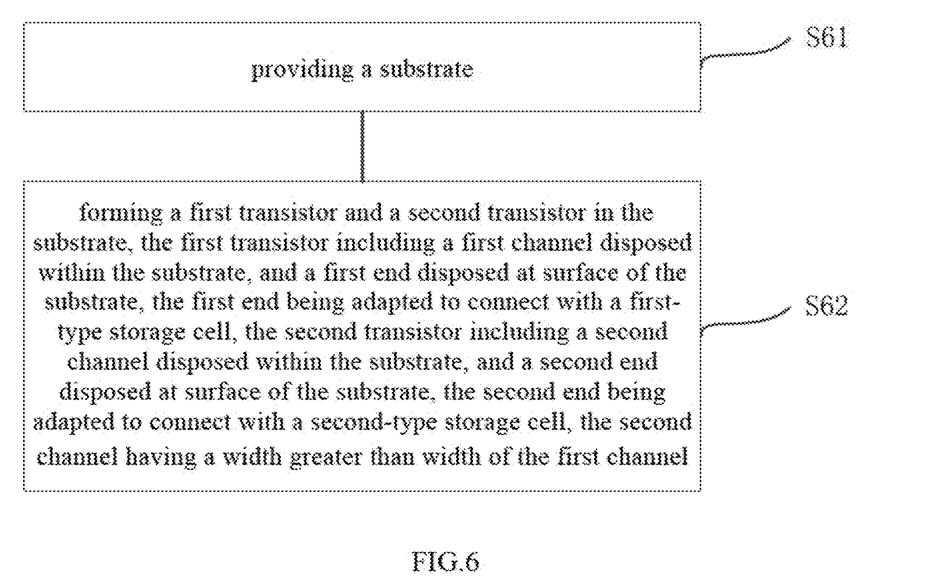
FIG. 6 is a flowchart illustrating the method of forming a semiconductor structure in the specific embodiments of the present application.

Furthermore, specific embodiments of the present application further propose a method of forming a semiconductor structure. FIG. 6 is a flowchart illustrating the method of forming a semiconductor structure in the specific embodiments of the present application. The semiconductor structure formed in the current specific embodiment is as schematically illustrated in FIGS. 1, 4 and 5. As shown in FIGS. 1 and 4-6, the method of forming a semiconductor structure proposed by the specific embodiments of the present application comprises the following steps:

Step S61: providing a substrate 10;

Step S62: forming a first transistor and a second transistor in the substrate 10, the first transistor including a first channel disposed within the substrate 10, and a first end 112 disposed at surface of the substrate 10, the first end 112 being adapted to connect with a first-type storage cell 15, the second transistor including a second channel disposed within the substrate 10, and a second end 122 disposed at surface of the substrate 10, the second end 122 being adapted to connect with a second-type storage cell 17, the second channel having a width W2 greater than width W1 of the first channel.

In some embodiments, the specific step of forming a first transistor and a second transistor in the substrate 10 includes the following:

forming an active area in the substrate 10, the active area including a first part 251 and a second part 252, and width of the second part 252 being greater than width of the first part 251;

forming a first gate slot and a second gate slot respectively in the first part 251 and the second part 252 of the active area, the active area being cut by the first gate slot and the second gate slot into a first end, a second end, and a common end between the first end and the second end; and filling gate material into the first gate slot and the second gate slot to form a first gate electrode and a second gate electrode.

In some embodiments, the method of forming a semiconductor structure further comprises the following steps:

etching the active area, to respectively form the first gate slot and the second gate slot at opposite sides of extension direction of the active area; and filling gate material in the first gate slot and the second gate slot in the active area, to form the first gate electrode and the second gate electrode.

In some embodiments, the forming method according to an embodiment of the present application further comprises:

forming in the substrate 10 a plurality of wordlines 22 extending along a first direction, wherein a plurality of the active areas are arranged within the substrate 10 in an array, the active areas extend along a second direction, and the second direction is inclined relative to the first direction for a predetermined angle.

In some embodiments, the first transistor in one of two adjacent active areas and the second transistor in another one of the active areas are disposed opposite each other along the second direction.

In some embodiments, the first transistor in one of two adjacent active areas and the second transistor in another one of the active areas correspond to the same and single wordline 22 along the first direction.

In some embodiments, the forming method according to an embodiment of the present application further comprises:

forming in the substrate 10 a plurality of wordlines 22 extending along a first direction, wherein the plurality of the active areas are arranged within the substrate 10 in an array, the active areas extend along a third direction, and the third direction is perpendicular to the first direction.

In some embodiments, the first transistors or the second transistors in the adjacent two active areas approach one another along the third direction.

In some embodiments, the wordline 22 includes first sub wordlines and second sub wordlines alternately arranged along the third direction, the first transistors in the plurality of the active areas arranged along the first direction all overlap with the same and single first sub wordline 221, and the second transistors in the plurality of the active areas arranged along the first direction all overlap with the same and single second sub wordline 222.

In some embodiments, projections of the two adjacent active areas arranged along the third direction partially overlap with each other, and the projections are projections of the active areas onto the third direction.

In some embodiments, the first-type storage cell 15 includes anyone of a capacitance storage cell, a resistance storage cell, a magnetic storage cell, a phase-change storage cell and a ferroelectric storage cell; the second-type storage cell 17 includes anyone of a capacitance storage cell, a resistance storage cell, a magnetic storage cell, a phase-change storage cell and a ferroelectric storage cell; the first-type storage cell 15 and the second-type storage cell 17 are different in storage type.

In some embodiments, the first-type storage cell 15 is a capacitance storage cell, and the second-type storage cell 17 is a magnetic storage cell.

The semiconductor structure and its forming method proposed by the embodiments of the present application achieve the effect of making fabrication techniques of the first transistor and the second transistor compatible, and simplify the fabrication method of the semiconductor structure by simultaneously disposing in the semiconductor structure a first transistor for connection with a first-type storage cell and a second transistor for connection with a second-type storage cell, locating the first channel and the second channel both inside the substrate, and defining the width of the first channel in the first transistor to be less than the width of the second channel in the second transistor. Moreover, it is ensured that drive current of the first transistor is less than drive current of the second transistor, and this is conducive to enhancing integration density of the storage cells of the first transistor and/or the second transistor in the memory, reduces the size of the storage cells, and lays foundation for enlarging the fields of application of the memory.

The foregoing description is merely directed to embodiments preferred by the present application. As should be pointed out, persons ordinarily skilled in the art may further make various improvements and modifications without departing from the conception of the present application, and all such improvements and modifications shall also be regarded to fall within the protection scope of the present application.

What is claimed is:

1. A semiconductor structure, comprising:
a substrate;
a first transistor, including a first channel disposed within the substrate, and a first end disposed at surface of the substrate, the first end being adapted to connect with a first-type storage cell; and
a second transistor, including a second channel disposed within the substrate, and a second end disposed at surface of the substrate, the second end being adapted to connect with a second-type storage cell, the second channel having a width greater than width of the first channel.

2. The semiconductor structure according to claim 1, wherein that the width of the second channel is 1.5 to 3 times that of the first channel.

3. The semiconductor structure according to claim 1, wherein that the substrate includes therein at least one first active area, in which are disposed two first transistors; and that
the two first transistors are distributed at opposite sides along extension direction of the first active area, and the two first transistors disposed in the first active area have a first common end.

4. The semiconductor structure according to claim 1, wherein that the substrate further includes therein at least one second active area, in which are disposed two second transistors; and that
the two second transistors are distributed at opposite sides along extension direction of the second active area, and the two second transistors disposed in the second active area have a second common end.

5. The semiconductor structure according to claim 1, wherein that the substrate further includes therein at least one third active area, in which are disposed the first transistor and the second transistor; and that
the first transistor and the second transistor are distributed at opposite sides along extension direction of the third active area, and the first transistor and the second transistor disposed in the third active area have a third common end.

6. The semiconductor structure according to claim 5, wherein that the substrate further includes therein a plurality of wordlines extending along a first direction; and that
a plurality of the third active areas are arranged within the substrate in an array, the third active areas extend along a second direction, and the second direction is inclined relative to the first direction for a predetermined angle.

7. The semiconductor structure according to claim 6, wherein that the first transistor and the second transistor disposed in the adjacent third active areas are oppositely arranged along the second direction.

8. The semiconductor structure according to claim 5, wherein that the substrate further includes therein a plurality of wordlines extending along a first direction; and that a plurality of the third active areas are arranged within the substrate in an array, the third active areas extend along a third direction, and the third direction is perpendicular to the first direction.

9. The semiconductor structure according to claim 8, wherein that the first transistors or the second transistors in the adjacent third active areas approach one another along the third direction.

10. The semiconductor structure according to claim 9, wherein that the wordline includes first sub wordlines and second sub wordlines alternately arranged along the third direction; that the first transistors in the plurality of the third active areas arranged along the first direction all overlap with the same and single first sub wordline; and that the second transistors in the plurality of the third active areas arranged along the first direction all overlap with the same and single second sub wordline.

11. The semiconductor structure according to claim 1, wherein that the first-type storage cell includes anyone of a capacitance storage cell, a resistance storage cell, a magnetic storage cell, a phase-change storage cell and a ferroelectric storage cell; that the second-type storage cell includes anyone of a capacitance storage cell, a resistance storage cell, a magnetic storage cell, a phase-change storage cell and a ferroelectric storage cell; and that the first-type storage cell and the second-type storage cell are different in storage type.

12. A method of forming a semiconductor structure, comprising the following steps:

providing a substrate; and forming a first transistor and a second transistor in the substrate, the first transistor including a first channel disposed within the substrate, and a first end disposed at surface of the substrate, the first end being adapted to connect with a first-type storage cell, the second transistor including a second channel disposed within the substrate, and a second end disposed at surface of the substrate, the second end being adapted to connect with a second-type storage cell, the second channel having a width greater than width of the first channel.

13. The method of forming a semiconductor structure according to claim 12, wherein that the step of forming a first transistor and a second transistor in the substrate includes:

forming an active area in the substrate, the active area including a first part and a second part, and width of the second part being greater than width of the first part;

forming a first gate slot and a second gate slot respectively in the first part and the second part of the active area, the active area being cut by the first gate slot and the second gate slot into a first end, a second end, and a common end between the first end and the second end; and filling gate material into the first gate slot and the second gate slot to form a first gate electrode and a second gate electrode.

14. The method of forming a semiconductor structure according to claim 13, wherein further comprising the following steps:

etching the active area, to respectively form the first gate slot and the second gate slot at opposite sides of extension direction of the active area; and filling gate material in the first gate slot and the second gate slot in the active area, to form the first gate electrode and the second gate electrode.

15. The method of forming a semiconductor structure according to claim 14, wherein further comprising:

forming in the substrate a plurality of wordlines extending along a first direction; wherein a plurality of the active areas are arranged within the substrate in an array, the active areas extend along a second direction, and the second direction is inclined relative to the first direction for a predetermined angle.

16. The method of forming a semiconductor structure according to claim 15, wherein that the first transistor in one of the two adjacent active areas and the second transistor in another one of the active areas are disposed opposite each other along the second direction.

17. The method of forming a semiconductor structure according to claim 14, wherein further comprising:

forming in the substrate a plurality of wordlines extending along a first direction; wherein the plurality of the active areas are arranged within the substrate in an array, the active areas extend along a third direction, and the third direction is perpendicular to the first direction.

18. The method of forming a semiconductor structure according to claim 17, wherein that the first transistors or the second transistors in the adjacent two active areas approach one another along the third direction.

19. The method of forming a semiconductor structure according to claim 18, wherein that the wordline includes first sub wordlines and second sub wordlines alternately arranged along the third direction; that the first transistors in the plurality of the active areas arranged along the first direction all overlap with the same and single first sub wordline; and that the second transistors in the plurality of the active areas arranged along the first direction all overlap with the same and single second sub wordline.

20. The method of forming a semiconductor structure according to claim 12, wherein that the first-type storage cell includes anyone of a capacitance storage cell, a resistance storage cell, a magnetic storage cell, a phase-change storage cell and a ferroelectric storage cell; that the second-type storage cell includes anyone of a capacitance storage cell, a resistance storage cell, a magnetic storage cell, a phase-change storage cell and a ferroelectric storage cell; and that the first-type storage cell and the second-type storage cell are different in storage type.

* * * * *